US009858975B1

(12) United States Patent
Hatcher

(10) Patent No.: US 9,858,975 B1
(45) Date of Patent: Jan. 2, 2018

(54) ZERO TRANSISTOR TRANSVERSE CURRENT BI-DIRECTIONAL BITCELL

(71) Applicant: Samsung Electronics Co., Ltd., Suwon-si, Gyeonggi-do (KR)

(72) Inventor: Ryan Michael Hatcher, Austin, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/385,828

(22) Filed: Dec. 20, 2016

Related U.S. Application Data

(60) Provisional application No. 62/379,210, filed on Aug. 24, 2016.

(51) Int. Cl.
*G11C 11/16* (2006.01)

(52) U.S. Cl.
CPC ........ *G11C 11/1673* (2013.01); *G11C 11/161* (2013.01); *G11C 11/1675* (2013.01)

(58) Field of Classification Search
CPC ............................... G11C 11/16; G11C 11/15
USPC .................................................. 365/158, 173
See application file for complete search history.

(56) References Cited

U.S. PATENT DOCUMENTS

| 5,691,934 | A | 11/1997 | Douglass |
| 6,351,410 | B1 * | 2/2002 | Nakao ................... B82Y 25/00 257/E27.005 |
| 6,879,512 | B2 | 4/2005 | Luo |
| 7,582,941 | B2 * | 9/2009 | Cho ....................... B82Y 10/00 257/421 |
| 7,933,137 | B2 | 4/2011 | Dimitrov et al. |
| 8,514,605 | B2 * | 8/2013 | Chen ...................... G11C 11/16 365/158 |
| 8,630,145 | B2 | 1/2014 | Sandhu |
| 8,830,725 | B2 | 9/2014 | Bethune et al. |

(Continued)

FOREIGN PATENT DOCUMENTS

WO    WO 2014204492 A1 * 12/2014 ............. G11C 11/18

OTHER PUBLICATIONS

Seow, "Commercialization of Germanium Based Nanocrystal Memory", B. Eng. (Electrical Engineering), Massachusetts Institute of Technology, Sep. 2007, (100 pages). https://pdfs.semanticscholar.org/5111/f421e9b5f842dfecb5a64264f6f28fc8db04.pdf?_ga=1.184643050.290192070.1482452614.

*Primary Examiner* — Michael Tran
(74) *Attorney, Agent, or Firm* — Lewis Roca Rothgerber Christie LLP

(57) ABSTRACT

A bitcell for storing a charge state, the bitcell including a spin hall metal for passing through a charge current, a magneto tunnel junction (MTJ) stack for generating and storing a non-volatile spin state corresponding to a binary bit in response to passage of the charge current through the spin hall metal, and for inducing the charge current corresponding to the non-volatile spin state in response to application of a read voltage, first and second write bitlines for sourcing the charge current through the spin hall metal in response to a write voltage being applied to both of the first and second write bitlines, and a read bitline for inducing the charge current through the spin hall metal in response to the read voltage being applied to the read bitline, and a first wordline and a second wordline for permitting a flow of the charge current through spin hall metal.

20 Claims, 11 Drawing Sheets

(56) References Cited

U.S. PATENT DOCUMENTS

| | | | |
|---|---|---|---|
| 8,841,739 B2* | 9/2014 | Khalili Amiri | H01L 43/08 |
| | | | 257/421 |
| 9,130,155 B2* | 9/2015 | Chepulskyy | H01L 43/08 |
| 9,230,626 B2* | 1/2016 | Buhrman | G11C 11/18 |
| 9,343,658 B2 | 5/2016 | Wang et al. | |
| 9,368,581 B2 | 6/2016 | Sandhu | |
| 9,589,619 B2* | 3/2017 | Lee | G11C 11/1673 |
| 2003/0174530 A1* | 9/2003 | Tran | G11C 11/16 |
| | | | 365/100 |
| 2008/0273365 A1* | 11/2008 | Kang | G11C 11/14 |
| | | | 365/51 |
| 2009/0046501 A1* | 2/2009 | Ranjan | G11C 11/15 |
| | | | 365/171 |
| 2009/0161265 A1* | 6/2009 | Sugano | G01R 33/1284 |
| | | | 360/324 |
| 2009/0218600 A1 | 9/2009 | Park et al. | |
| 2010/0097852 A1* | 4/2010 | Chen | G11C 11/16 |
| | | | 365/171 |
| 2012/0075906 A1* | 3/2012 | Ho | G11C 11/16 |
| | | | 365/148 |
| 2013/0223125 A1* | 8/2013 | DeBrosse | G11C 5/025 |
| | | | 365/148 |
| 2014/0124882 A1* | 5/2014 | Khalili Amiri | H01L 43/08 |
| | | | 257/421 |
| 2015/0070981 A1* | 3/2015 | Kumura | H01L 27/228 |
| | | | 365/158 |
| 2016/0071582 A1* | 3/2016 | Chung | G11C 11/1675 |
| | | | 365/96 |
| 2016/0225423 A1 | 8/2016 | Naik et al. | |

* cited by examiner

ZERO TRANSISTOR TRANSVERSE CURRENT BI-DIRECTIONAL BITCELL

CROSS-REFERENCE TO RELATED APPLICATION(S)

This application claims priority to and the benefit of U.S. Provisional Patent Application No. 62/379,210, filed on Aug. 24, 2016, the entire content of which is incorporated herein by reference.

This application is also related to U.S. Provisional Patent Application No. 62/281,626, filed on Jan. 21, 2016, the entire content of which is incorporated herein by reference.

FIELD

Aspects of the present invention relate to the field of data retention in memory systems.

BACKGROUND

Conventional spin torque transfer (STT) magnetic random access memory (MRAM) stores a charge state, representative of a binary bit, by passing a charge current through a magneto tunnel junction (MTJ), which has a tunnel barrier stacked between a free magnetic layer and a pinned (or fixed) magnetic layer. The charge current affects the magnetic moment of the free layer to either be aligned or anti-aligned with the magnetic moment of the pinned layer (which is unaffected by the current). As the alignment of magnetic moments remains unchanged in the absence of the charge current, the MTJ stack behaves as a bi-stable system suitable for memory storage.

However, STT MRAM has a number of disadvantages that have stood in the way of widespread adoption of this technology for memory storage: (1) STT MRAM exhibits slow write speeds (e.g., 10's of ns) as compared to existing static RAM (SRAM) and dynamic RAM (DRAM) technology with write speeds on the order of 100's of ps and a few ns, respectively; (2) large write currents are required as compared to existing technologies; (3) large write currents passing through the MTJ breakdown the oxide and limit endurance; (4) if read current is sufficiently large, it can undesirably flip the MRAM cell; and (5) die density is limited by the need for at least one access transistor per bitcell.

The above information disclosed in this Background section is only for enhancement of understanding of the background of the invention, and therefore it may contain information that does not form the prior art that is already known to a person of ordinary skill in the art.

SUMMARY

Aspects of embodiments of the present invention are directed to a transverse current bi-directional bitcell with an architecture that leverages spin orbit torque (SOT) and does not require an access transistor, unlike conventional MRAM. As such, embodiments of the present invention reduce the number of transistors required for a given block of cache/memory. According to some embodiments, the transverse current bi-directional bitcell utilizes a conductor with a large spin hall angle adjacent to a free layer of a magneto tunnel junction (MTJ) stack. The MTJ is written by a diffusive spin torque current injected from an interface across which a charge current flows. In some embodiments, the spin current can be substantially larger than the charge current, thus reducing the magnitude of the write current used to store a charge state at the bitcell. As the write charge current is transverse to the free layer, and does not flow through the MTJ (and in particular its tunnel barrier), endurance of the bitcell may be improved (e.g., increased).

According to some embodiments of the present invention, there is provided a transverse current bi-directional bitcell coupled to an external circuit and configured to store a charge state, the transverse current bi-directional bitcell including: a spin hall metal configured to pass through a charge current; a magneto tunnel junction (MTJ) stack on the spin hall metal and configured to generate and store a non-volatile spin state corresponding to a binary bit in response to passage of the charge current through the spin hall metal, and to induce the charge current corresponding to the non-volatile spin state in response to application of a read voltage; a first write bitline and a second write bitline electrically isolated from the first write bitline, the first and second write bitlines being electrically coupled to the spin hall metal via a pair of write diodes having opposite polarity, the first and second write bitlines being configured to source the charge current through the spin hall metal, during a write operation, in response to a write voltage being applied to both of the first and second write bitlines; and a read bitline electrically coupled to the MTJ stack via a read diode, the read bitline being configured to induce the charge current through the spin hall metal, during a read operation, in response to the read voltage being applied to the read bitline; and a first wordline and a second wordline electrically coupled to the spin hall metal via a pair of access diodes having opposite polarity and configured to permit a flow of the charge current through spin hall metal in response to a same voltage being applied to the first and second wordlines.

In some embodiments, the first write bitline is electrically isolated from the second write bitline, and the second wordline is electrically isolated from the first wordline.

In some embodiments, the spin hall metal exhibits a large spin hall angle such that a density of spin torque current flowing through the MTJ stack is larger than that of the transverse charge current flowing through the spin hall metal.

In some embodiments, the spin hall metal includes beta tantalum, platinum, and/or copper bismuth.

In some embodiments, the MTJ stack contacts the spin hall metal at an interface plane, and the MTJ stack includes: a free layer including magnetic material and configured to exhibit an easy axis of magnetization parallel with the interface plane, and to respond to a spin current corresponding to the charge current flowing through the spin hall metal based on a giant spin hall effect; a pinned layer including magnetic material and exhibiting a fixed axis of magnetization parallel with the interface plane and unaffected by stray fields resulting from the charge current flowing through the spin hall metal; and a non-magnetic layer between the free and pinned layers and configured to magnetically isolate a free magnetic moment of the free layer from a fixed magnetic moment of the pinned layer and to maintain any existing difference in directionality of the free and fixed magnetic moments.

In some embodiments, the MTJ stack has an elliptical cross section along a transverse direction parallel with the interface plane, the elliptical cross section having a long axis in a same direction as a fixed axis of magnetization of the pinned layer.

In some embodiments, in response to the charge current flowing through the spin hall metal, the MTJ stack is configured to exhibit magnetic moments having a parallel configuration or anti-parallel configuration, and the MTJ stacks is configured to maintain the parallel or anti-parallel configuration even when no power is provided to the transverse current bi-directional bitcell.

In some embodiments, a magnitude of the write voltage is greater than or equal to a forward-bias voltage of the pair of write diodes, a magnitude of the read voltage is greater than or equal to a forward-bias voltage of the read diodes, and the same voltage being applied to the first and second wordlines is zero volts during the write operation, and has a magnitude greater than or equal to a forward-bias voltage of the pair of access diodes.

In some embodiments, the first and second write bitlines are coupled to the spin hall metal on one side of the MTJ stack, and the first and second wordlines are coupled to the spin hall metal on an opposite side of the MTJ stack, and the read bitline is electrically coupled to a pinned layer of the MTJ stack.

In some embodiments, the first write bitline and the first wordline are coupled to the spin hall metal on one side of the MTJ stack, and the second write bitline and the second wordline are coupled to the spin hall metal on an opposite side of the MTJ stack, and the read bitline is electrically coupled to a pinned layer of the MTJ stack.

In some embodiments, the charge current is transverse to a stacking direction of the MTJ stack and does not flow through the MTJ stack during the write operation.

According to some embodiments of the present invention, there is provided a method of controlling an operational state of a transverse current bi-directional bitcell configured to store a charge state using an external circuit and, the method including: selectively applying a write voltage to a first write bitline and a second write bitline that are electrically isolated from each other, the first and second write bitlines being electrically coupled to a spin hall metal via a pair of write diodes having opposite polarity; selectively applying a read voltage to a read bitline electrically coupled to a magneto tunnel junction (MTJ) stack on the spin hall metal via a read diode; and selectively applying a first voltage to a first wordline and a second voltage to a second wordline, the first wordline and a second wordline being electrically isolated from each other and being electrically coupled to the spin hall metal via a pair of access diodes having opposite polarity.

In some embodiments, the MTJ stack contacts the spin hall metal at an interface plane, and the MTJ stack includes: a free layer including magnetic material and configured to exhibit an easy axis of magnetization parallel with the interface plane, and to respond to a spin current corresponding to a charge current flowing through the spin hall metal based on a giant spin hall effect; a pinned layer including magnetic material and exhibiting a fixed axis of magnetization parallel with the interface plane and unaffected by stray fields resulting from the charge current flowing through the spin hall metal; and a non-magnetic layer between the free and pinned layers and configured to magnetically isolate a free magnetic moment of the free layer from a fixed magnetic moment of the pinned layer and to maintain any existing difference in directionality of the free and fixed magnetic moments.

In some embodiments, the method further includes disabling the bitcell by: reverse-biasing the read diode by applying a negative voltage to the read bitline; reverse-biasing the pair of write diodes by applying the negative voltage to the first write bitline and applying a positive voltage to the second write bitline; and reverse-biasing the pair of access diodes by applying the negative voltage to the first wordline and applying the positive voltage to the wordline.

In some embodiments, the positive voltage is greater than or equal to a forward-bias voltage of the pair of write and access diodes, and the negative voltage has a same magnitude as that of positive voltage and has a polarity opposite that of the positive voltage.

In some embodiments, the method further includes writing a charge state to the bitcell by: reverse-biasing the read diode by applying a negative voltage to the read bitline; reverse-biasing the pair of access diodes by applying a ground voltage to the first and second wordlines; and forward-biasing one of the pair of write diodes by applying the write voltage to the first and second write bitlines to establish a charge current through the spin hall metal, the charge current inducing a magnetic moment in a free layer of the MTJ stack corresponding to a binary bit.

In some embodiments, applying the write voltage to the first and second write bitlines reverse-biases an other one of pair of write diodes.

In some embodiments, the write voltage is equal to a positive voltage or the negative voltage, and the positive voltage is greater than or equal to a forward-bias voltage of the pair of write diodes.

In some embodiments, the method further includes reading a charge state from the bitcell by: forward-biasing the read diode by applying a positive voltage to the read bitline; reverse-biasing the pair of write diodes by applying the positive voltage to one of the pair of write diodes and by applying a negative voltage to an other one of the pair of write diodes; and forward-biasing one of the pair of access diodes by applying the negative voltage to the first and second wordlines to establish a charge current through the spin hall metal, the charge current corresponding to a magnetic moment in a free layer of the MTJ stack, the magnetic moment corresponding to a stored binary bit.

In some embodiments, applying the read voltage to the first and second wordlines reverse-biases an other one of pair of access diodes.

BRIEF DESCRIPTION OF THE DRAWINGS

The accompanying drawings, together with the specification, illustrate example embodiments of the present invention, and, together with the description, serve to explain the principles of the present invention.

DETAILED DESCRIPTION

Figure 1A:
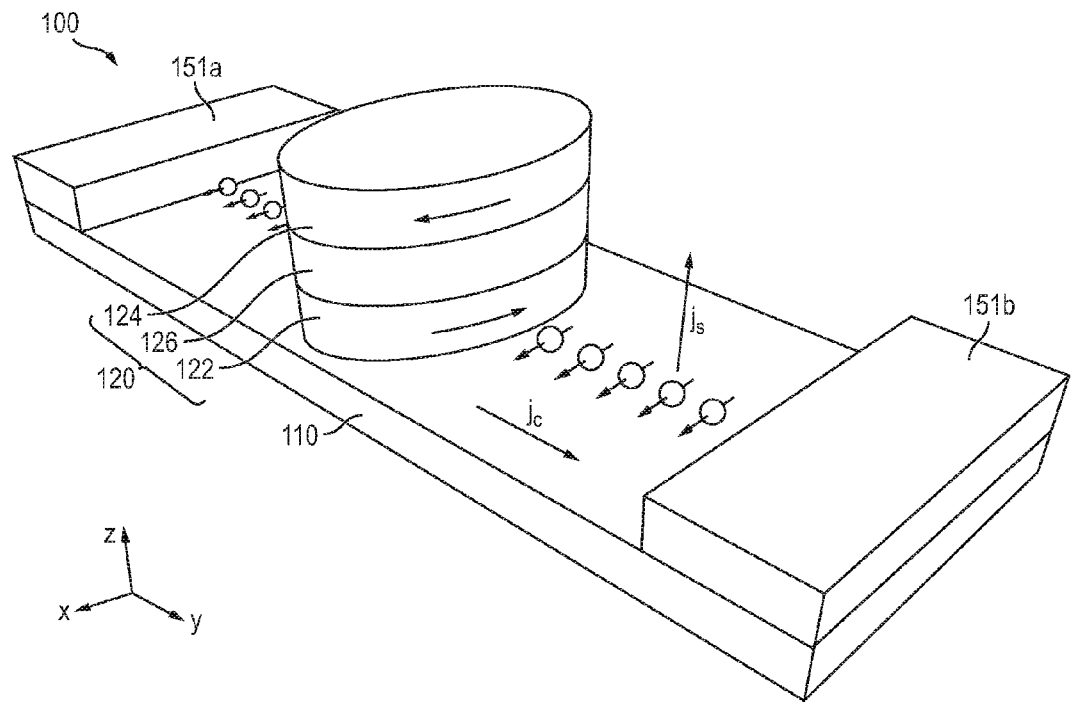
FIG. 1A is a perspective view of a transverse current spin hall retention cell of a bitcell, according to some example embodiments of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Descriptions of features or aspects within each exemplary embodiment should typically be considered as applicable to other similar features or aspects in other exemplary embodiments. Like reference numerals designate like elements throughout the specification.

Figure 1B:
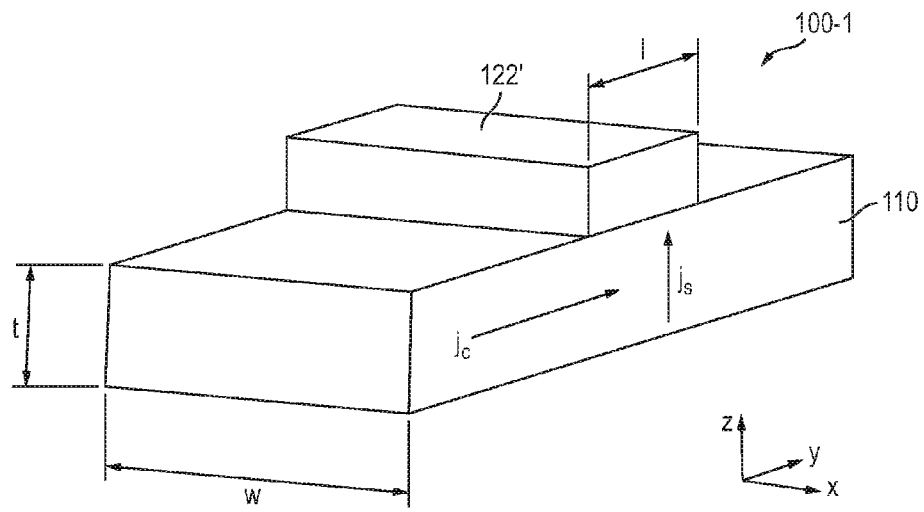
FIG. 1B illustrates a simplified representation of the transverse current spin hall retention cell of FIG. 1A.

FIG. 1A is a perspective view of a transverse current spin hall retention cell 100 of a bitcell, according to some example embodiments of the present invention. FIG. 1B illustrates a simplified representation of the transverse current spin hall retention cell 100 of FIG. 1A. The retention cell 100 is a component of a bitcell having bitlines coupling the retention cell 100 to an external circuit and allowing for various operations to be performed on the retention cell 100. However, for ease of illustration, the bitlines and external circuitry are omitted from FIGS. 1A-1B.

Referring to FIG. 1A, the transverse current spin hall retention cell 100 includes a spin hall metal 110 and a magneto tunnel junction (MTJ) stack 120 on the spin hall metal 110. The MTJ stack 120 includes a free layer 122 on (e.g., adjacent to or contacting) the spin hall metal 110, a pinned layer (e.g., a fixed layer or a reference layer) 124 on the free layer 122 opposite from the spin hall metal 110, and a nonmagnetic tunneling barrier layer (also referred to as a non-magnetic layer) 126 separating the free and pinned layers 122 and 124. Thus, the MTJ stack 120 is stacked in a direction (e.g., the Z direction) orthogonal to the interface between the spin hall metal 110 and the MTJ stack 120. The pinned layer 124 includes magnetic material that exhibits a fixed (e.g., a pinned or permanent) axis of magnetization parallel to the interface between the spin hall metal 110 and the MTJ stack 120 and in a direction (e.g., the X direction) orthogonal to (or substantially orthogonal to) the lengthwise direction (e.g., the Y direction) of the spin hall metal 110. The free layer 122 also includes magnetic material and has an easy axis of magnetization that is parallel or anti-parallel to that of the pinned layer 124.

Contacts 151a and 151b at opposite ends of the spin hall metal 110 (e.g., spaced apart along the Y direction), which are connected to an external circuit (not shown), may apply a voltage differential across the length of the spin hall metal that established a charge current flux $J_C$ along the length of the spin hall metal 110 (e.g., flowing along the Y direction). According to some embodiments, the charge current flux $J_C$ flowing across the interface of the spin hall metal 110 and MTJ stack 120 leads to the injection of a diffusive spin torque current (represented by spin current flux $J_S$) through the free layer 122 in the stacking direction of the MTJ stack 120 (e.g., in the Z direction), which influences the magnetic moment of the free layer 122 causing it to be either parallel with or anti-parallel with the direction of magnetic moment of the pinned layer 124. The pinned layer 124 exhibits a fixed axis of magnetization that is unaffected by (e.g., immune to) stray fields resulting from the charge current flowing through the spin hall metal 110.

The nonmagnetic tunneling barrier layer 126 magnetically isolates the free magnetic moment of the free layer 122 from the fixed magnetic moment of the pinned layer 124 and aids in maintaining any existing difference in directionality of the free and fixed magnetic moments. As the parallel or anti-parallel configuration of the MTJ stack 120 persists even in the absence of the transverse charge current, the configuration may be used to represent a stored binary bit. For example, a parallel configuration may represent a stored binary bit '1', and an anti-parallel configuration may represent a stored binary bit '0'. However, embodiments of the present invention are not limited thereto, and the parallel and anti-parallel magnetic orientations may represent a binary '0' state and a binary '1' state, respectively.

In the example shown in FIGS. 1A-1B, as a result of the charge current flux $J_C$, the axis of magnetization of the free layer 122 may be either in the X or −X direction.

The magnitude of the spin current flux $J_S$ is linearly tied to that of the charge current flux $J_C$ via the spin hall angle $\theta_{SH}$, which is an intrinsic property of the spin hall metal 110. The relationship may be expressed by Equations 1:

$$\theta_{SH} = \frac{J_S}{J_C} \quad \text{(Equation 1)}$$

The spin hall angle property leads to the transverse current spin hall retention cell 100 exhibiting current gain, which can be determined by the geometry of the spin hall retention cell 100. Referring to FIG. 1B, the geometry of the free layer may be represented in simplified form as a rectangular cuboid 122' in which the width w of the cuboid is the same as that of the spin hall metal 110, and the length l is chosen such that the interface area $A_S$ (=l×w) is the same or substantially the same as that of the interface between the spin hall metal 110 and the MTJ stack 120 shown in FIG. 1A. The current gain of the spin hall retention cell 100 may be expressed using the following Equations:

$$\frac{I_S}{I_C} = \frac{J_S A_S}{J_C A_C} = \frac{J_S l w}{J_C t w} = \theta_{SH} \frac{l}{t} \quad \text{(Equation 2)}$$

$$I_S = \theta_{SH} \frac{l}{t} I_C \quad \text{(Equation 3)}$$

where t represents a thickness of the spin hall metal 110. Thus, the spin hall retention cell 100 exhibits a current gain if $$\theta_{SH} \frac{l}{t} > 1.$$

Because a particular magnitude of spin current is required to flip the charge state (i.e., the magnetization configuration) of the MTJ stack 120, by selecting a suitable material having a high spin hall angle $\theta_{SH}$ and a geometric design having a high l/t ratio, the present invention may reduce the required write charge current and lower (e.g., minimize) the power consumption of the transverse current spin hall retention cell 100.

Figure 2A:
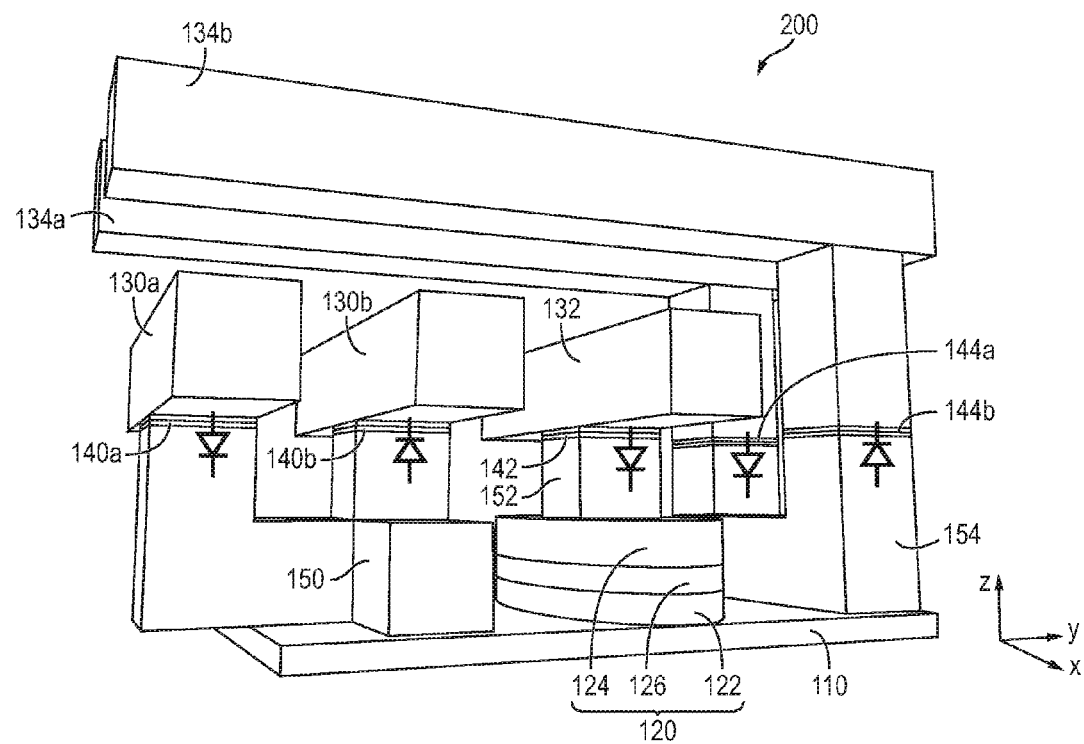
FIGS. 2A-2B are perspective views of a transverse current bi-directional bitcell, according to some example embodiments of the present invention.
Figure 2B:
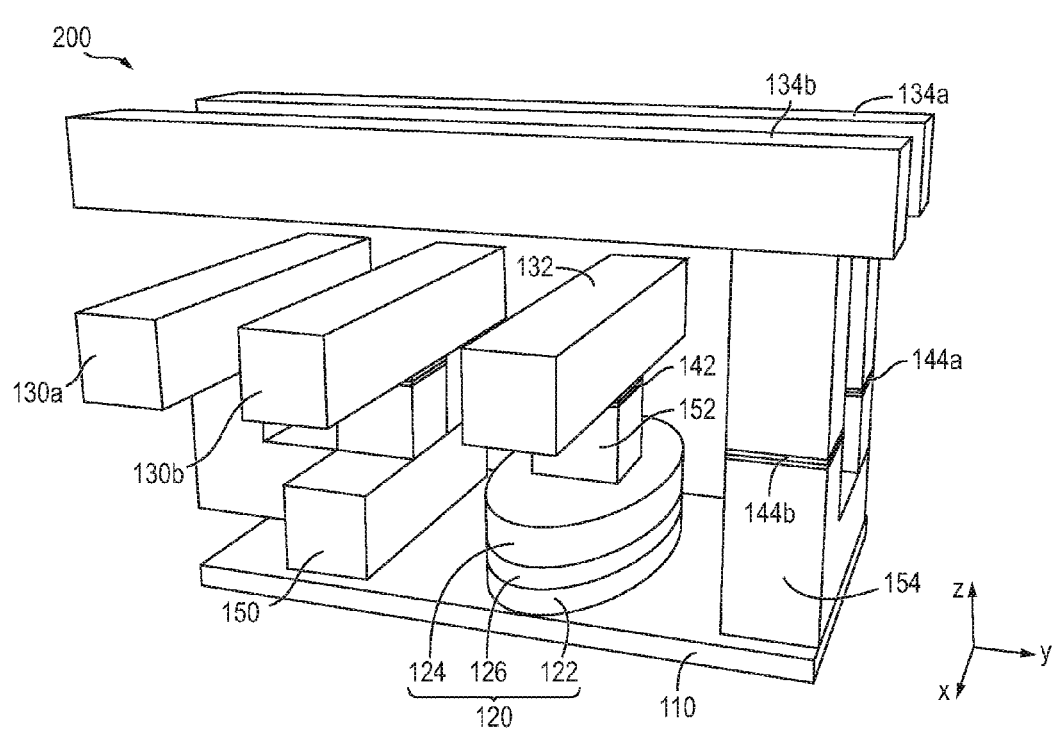

FIGS. 2A-2B are perspective views of a transverse current bi-directional bitcell 200, according to some example embodiments of the present invention. The spin hall retention cell 100 utilized in the transverse current bi-directional bitcell 200 (hereinafter also referred to simply as a "bitcell"), is the same or substantially the same as that described above with respect to FIG. 1A, thus a detailed discussion thereof may not be repeated.

Referring to FIGS. 2A-2B, the bitcell 200 includes the spin hall metal 110 and the MTJ stack 120. In some examples, the spin hall metal 110 may be conductor including beta tantalum, platinum, copper bismuth (CuBi), and/or the like. The free layer 122 may be a magnetic material including iron (Fe), tantalum (Ta), a cobalt iron alloy (e.g., CoFe), a cobalt iron boron alloy (e.g., CoFeB), and/or the like. The pinned layer 124 may be a magnetic material including cobalt (Co), tantalum (Ta), platinum (Pt), ruthenium (Ru), a cobalt iron boron alloy (e.g., CoFeB), and/or the like. The tunneling barrier layer 126 may include non-magnetic material such as crystalline magnesium oxide (MgO), amorphous aluminum oxide, and/or the like.

In some embodiments, the nonmagnetic tunneling barrier layer 126 serves to magnetically isolate the magnetic moment (e.g., free magnetic moment) of the free layer 122 from the pinned (e.g., fixed) magnetic moment of the pinned layer 124 and to maintain any existing difference in directionality of the free and pinned magnetic moments (i.e., prevent the fixed magnetic moment of the pinned layer 124 from influencing and changing the directionality of the free magnetic moment of the free layer 122).

While FIGS. 2A-2B illustrate the free and pinned layers 122 and 124 as each having a single layer, for ease of illustration, embodiments of the present invention are not limited thereto. In some examples, each of the free and pinned layers 122 and 124 may include a plurality of layers. For example, the free layer 122 may include magnetic layers interleaved with thin conductive layers such as tantalum (Ta), and/or the like, and the pinned layer 124 may be a synthetic antiferromagnetic (SAF) layer including magnetic layers antiferromagnetically coupled through and interleaved with thin conductive layers, such as tantalum (Ta), ruthenium (Ru) and/or the like.

According to some embodiments, the bitcell 200 further includes a first write bitline (BLW+) 130a and a second write bitline (BLW−) 130b coupled to the spin hall metal 110, a read bitline (BLR) 132 coupled to the MTJ stack 120, and a first wordline (WL+) 134a and a second wordline (WL−) 134b coupled to spin hall metal 110.

In some embodiments, the first and second write bitlines 130a and 130b are electrically coupled to the spin hall metal 110 via a pair of write diodes 140a and 140b having opposite polarity, which electrically isolate the first and second write bitlines 130a and 130b from one another, and ensure that no more than one of the first and second write bitlines 130a and 130b is electrically coupled to the spin hall metal 110 at any given time. In some examples, the cathode of the first write diode 140a and the anode of the second write diode 140b are coupled to the spin hall metal 110, the anode of the first write diode 140a is connected to the first write bitline 130a, and the cathode of the second write diode 140b is coupled to the second write bitline 130b. The first and second write bitlines 130a and 130b may source the charge current through the spin hall metal 110, during a write operation, in response to a write voltage being applied to both the first and second write bitlines.

In some embodiments, the read bitline 132 is electrically coupled to the MTJ stack via a read diode 142. In some examples, the anode of the read diode 142 may be coupled to the read bitline 132, while the cathode of the read diode 142 is coupled to the MTJ stack (e.g., to the pinned layer 124). The read bitline 132 may induce a charge current through the spin hall metal 110, during a read operation, in response to a read voltage being applied to the read bitline 132.

According to some embodiments of the present invention, the first and second wordlines 134a and 134b are electrically coupled to the spin hall metal 110 via a pair of access diodes 144a and 144b having opposite polarity, which electrically isolate the first and second write bitlines 130a and 130b from one another, and ensure that no more than one of the first and second write bitlines 130a and 130b is electrically coupled to the spin hall metal 110 at any given time. In some examples, the cathode of the first access diode 144a and the anode of the second access diode 144b are coupled to the spin hall metal 110, the anode of the first access diode 144a is connected to the first wordline 134a, and the cathode of the second access diode 144b is coupled to the second wordline 134b. The first and second wordlines 134a and 134b may permit the flow of the charge current through the spin hall metal in response to a same voltage being applied to the first and second wordlines.

The MTJ stack 120 generates and stores a non-volatile spin state corresponding to a binary bit (e.g., '0' or '1') in response to passage of the charge current through the spin hall metal 110, and induces the charge current signal corresponding to the non-volatile spin state in response to application of the read voltage. In some examples, the MTJ stack 120 has an elliptical cross section along a transverse direction parallel with the interface plane (i.e., the X-Y plane) in which the long axis of the elliptical cross section is in the same direction as the fixed axis of magnetization of the pinned layer 124. However, embodiments of the present invention are not limited thereto, and the MTJ stack 120 may be a rectangular cuboid with a long side extending parallel with the fixed axis of magnetization of the pinned layer 124.

As shown in FIGS. 2A-2B, in some examples, the pair of write diodes 140a and 140b are coupled to one end of the spin hall metal 110 via a first contact 150, the read diode 142 is coupled to the MTJ stack 120 via a second contact 152, and the access diodes 144a and 144b are coupled to another end of the spin hall metal 110 via a third contact 154. In the illustrated example, the first and third contacts 150 and 154 are on opposite sides of the MTJ stack 120. However, embodiments of the present invention are not limited thereto. For example, the first write diode 140a and the first access diode 144a may be on a same side of the MTJ stack 120 that is opposite to the second write diode 140b and the second access diode 144b.

The diodes referred to herein, such as the pair of write diodes 140a and 140b, the read diode 142, and the first and second access diodes 144a and 144b, may be any suitable diode. For example, the diodes may be Cu/Ta/TaN/TaON/Cu diodes having sufficient forward-reverse bias ratios (e.g., about $10^5$).

According to some examples, the thickness (e.g., height along the Z direction) of the spin hall metal 110 may be about 1 nm to about 10 nm (e.g., about 4 nm), the thickness of the free layer 122 may be about 1 nm to about 5 nm (e.g., about 1 nm), the thickness of the nonmagnetic tunneling barrier layer 126 may be about 1 nm to about 2 nm (e.g., about 1 nm), the thickness of the pinned layer 124 may be about 4 nm to about 10 nm (e.g., about 4 nm). In some examples, the pinned layer 124 include one or more layers, each of which may be about 1 nm to about 10 nm.

By controlling the voltages applied to the first and second write bitlines 130a and 130b, the read bitline 132, and the first and second wordlines 134a and 134b, the bitcell 200 can be written to, read from, or disabled from writing or reading.

Figure 3:
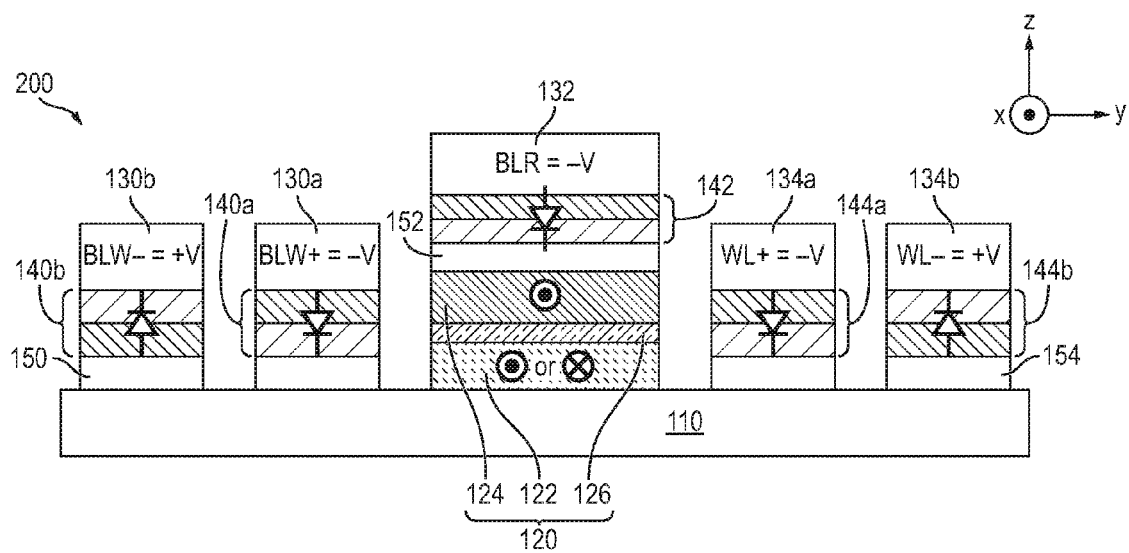
FIG. 3 is a cross-sectional schematic representation of the transverse current bi-directional bitcell when in disable mode, according to some example embodiments of the present invention.

FIG. 3 is a cross-sectional schematic representation of the transverse current bi-directional bitcell 200 when in disable mode, according to some example embodiments of the present invention.

Referring to FIG. 3, in some embodiments, the bitcell 200 may be placed in disable mode by reverse-biasing the pair of write diodes 140a and 140b, the read diode 142, and the pair of access diodes 144a and 144b. Such a state prevents any current from flowing through the spin hall metal 110 and the MTJ stack 120, which will prevent any reading or writing operations from being performed on the bitcell 200. In the disabled state, the parallel or anti-parallel configuration of the MTJ stack 120 is retained, and the bitcell 200 serves as a non-volatile retention latch maintaining its charge state with zero (or near zero) leakage.

In some examples, the bitcell 200 may be placed in disable mode by applying a negative voltage (−V) to the first write bitline 130a, the read bitline 132, and the first wordline 134a, and by applying a positive voltage (+V) to the second write bitline 130b and the second wordline 134b. The positive voltage may be any voltage sufficiently large to forward-bias the diodes 140a/b, 142, and 142a/b (e.g., a voltage greater than 0.5 V and the negative voltage may have the same magnitude as the positive voltage but with opposite polarity (e.g., a voltage less than −0.5 V.

Figure 4A:
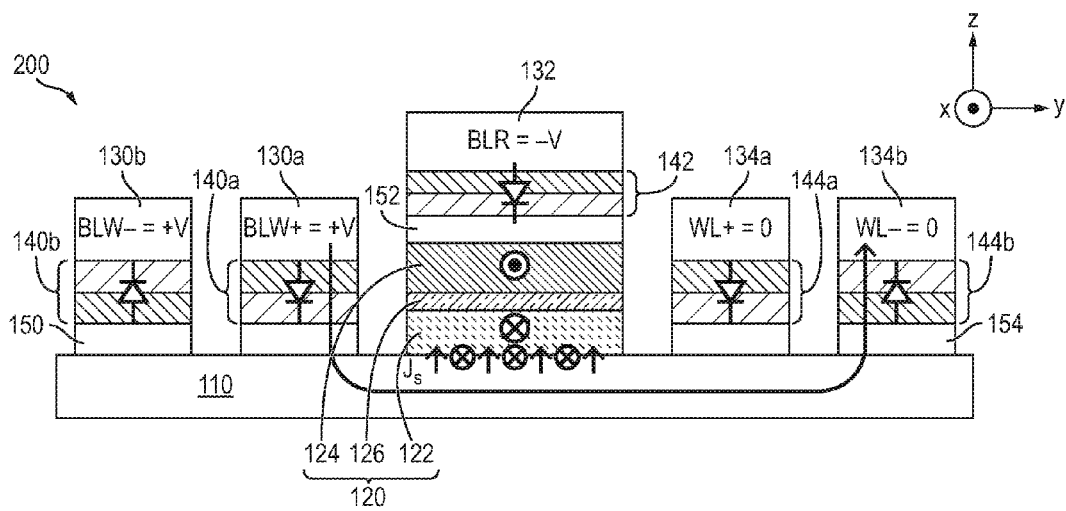
FIGS. 4A-4B are cross-sectional schematic representations of the transverse current bi-directional bitcell when in write mode, according to some example embodiments of the present invention.
Figure 4B:
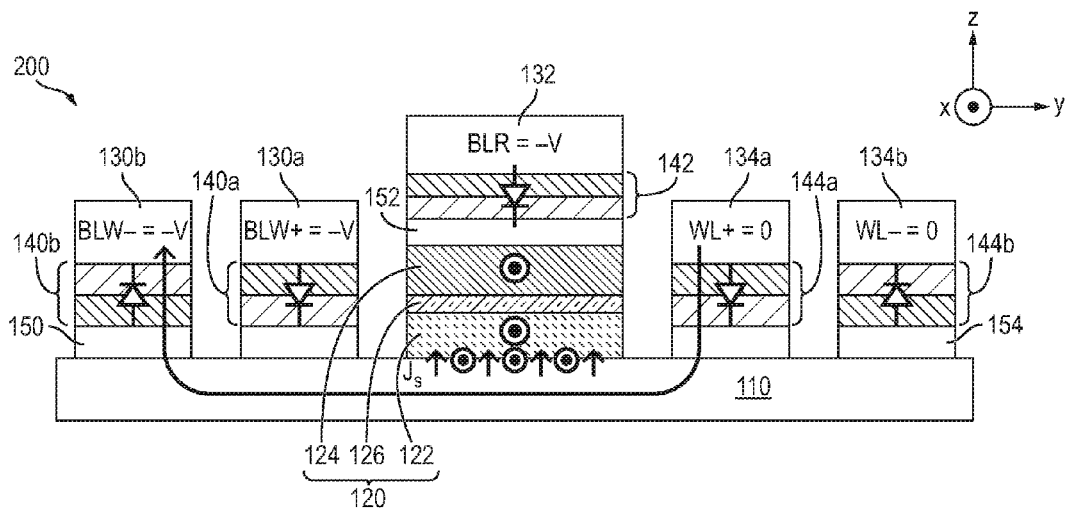

FIGS. 4A-4B are cross-sectional schematic representations of the transverse current bi-directional bitcell 200 when in write mode, according to some example embodiments of the present invention.

Referring to FIGS. 4A-4B, in some embodiments, the bitcell 200 may be written to by forward-biasing one of the first and second write diodes 140a and 140b and one of the first and second access diodes 144a and 144b, and by reverse-biasing the remainder of the diodes. In some examples, this may be achieved by applying the negative voltage (−V) to the read bitline 132, applying a ground voltage (e.g., 0V) to both of the wordlines 134a and 134b, and applying the positive voltage (+V) to one of the first and second write bitlines 130a and 130b and applying the negative voltage to the other.

In the example of FIGS. 4A-4B, by applying the positive voltage only to the first write bitline 130a, a charge current is established between the first write bitline 130a and the second wordline 134b and through the spin hall metal (e.g., in the +Y direction), which induces a magnetic moment in the free layer 122 of the MTJ stack 120 that is anti-parallel with the magnetic moment of the pinned layer 124 (e.g., is in the −X direction). This may be tantamount to writing a '0' binary bit in the bitcell 200. Similarly, by applying the positive voltage only to the second write bitline 130b, a charge current is established between the second write bitline 130b and the first wordline 134a and through the spin hall metal (e.g., in the −Y direction), which induces a magnetic moment in the free layer 122 of the MTJ stack 120 that is parallel with the magnetic moment of the pinned layer 124 (e.g., is in the +X direction). This may be tantamount to writing a '1' binary bit in the bitcell 200.

Figure 5A:
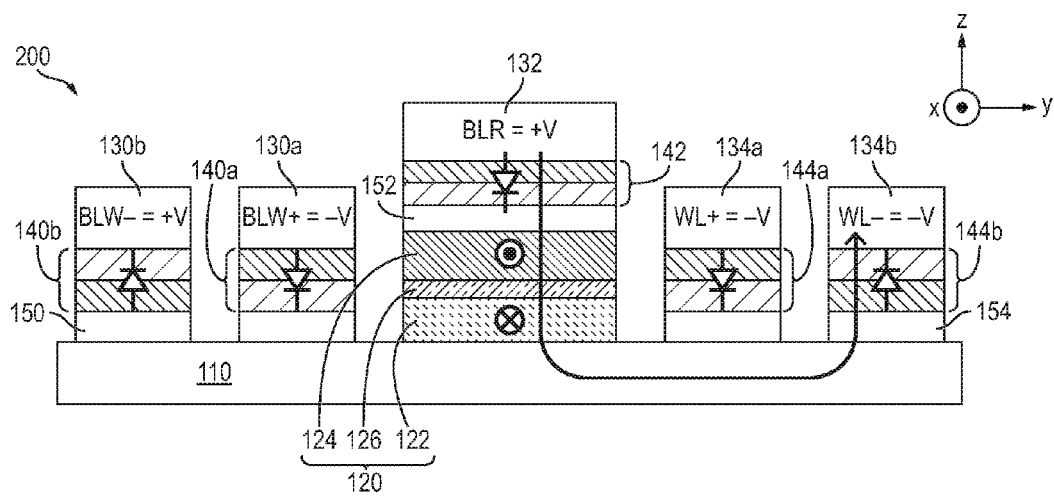
FIGS. 5A-5B are cross-sectional schematic representations of the transverse current bi-directional bitcell when in read mode, according to some example embodiments of the present invention.
Figure 5B:
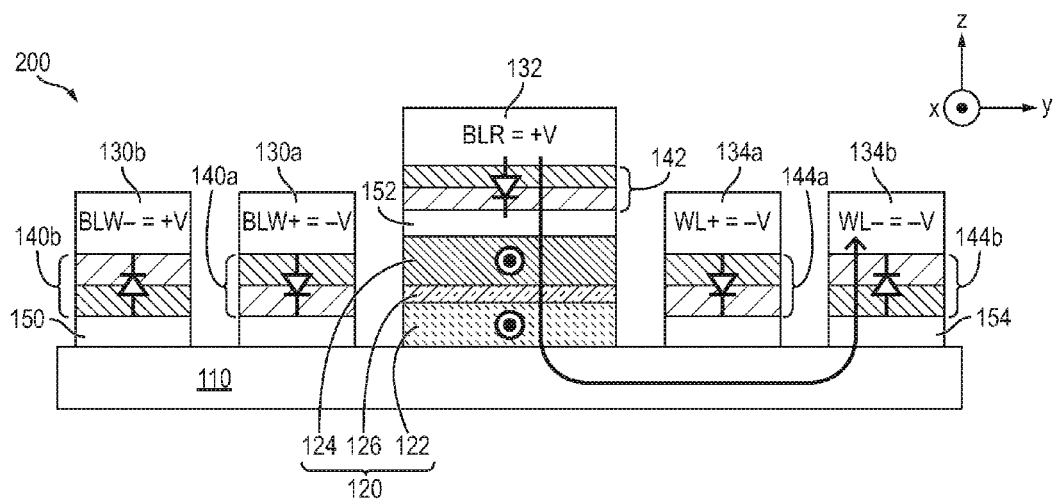

FIGS. 5A-5B are cross-sectional schematic representations of the transverse current bi-directional bitcell 200 when in read mode, according to some example embodiments of the present invention.

Referring to FIGS. 5A-5B, in some embodiments, the bitcell 200 may be read from by forward-biasing the read diode 142 and one of the first and second access diodes 144a and 144b, and by reverse-biasing the remainder of the diodes. In some examples, this may be achieved by applying the positive voltage (+V) to the read bitline 132, applying the negative voltage (−V) to both of the wordlines 134a and 134b, and applying the positive voltage (+V) to one of the first and second write bitlines 130a and 130b and applying the negative voltage to the other.

In the example of FIGS. 5A-5B, by applying the positive voltage to the read bitline 132a, a charge current is established between the read bitline 132 and the second wordline 134b and through the MTJ stack 120 and the spin hall metal (e.g., in the +Y direction). When the MTJ stack 120 has an anti-parallel configuration (as shown in FIG. 5A), the MTJ stack 120 exhibits a large resistance leading to a small charge current, which can be measured by a current sensor coupled to the second wordline 134b. When the MTJ stack 120 has a parallel configuration (as shown in FIG. 5B), the MTJ stack 120 exhibits a small resistance leading to a relatively large charge current, which again can be measured by a current sensor coupled to the second wordline 134b. Here, the resistance of spin hall metal 110 is small relative to the resistance of the MTJ stack 120. In some examples, the low resistance multiplied area product (RA) of the MTJ stack 120 may be a few $\Omega^*\mu m^2$ to a few tens of $\Omega^*\mu m^2$ and the ratio of high to low resistance may be about 1.5 to about 2. For example, the MTJ stack 120 has an RA of 5 $\Omega^*\mu m^2$, an area of 0.0078 $\mu m^2$, a resistance of about 637$\Omega$ in a low-resistance state, and a resistance of about 1273$\Omega$ in the high-resistance state. In some examples, the ratio of the large charge current to small charge current may be about 1.5 to about 2.0. Thus, by measuring the charge current at the wordlines, it may be determined whether the bitcell 200 is storing a '0' or '1' binary bit. According to some embodiments, due to the spin amplification (see Equation 3), the read operation may be performed without disturbing the magnetization state of the MTJ stack 120.

Figure 6:
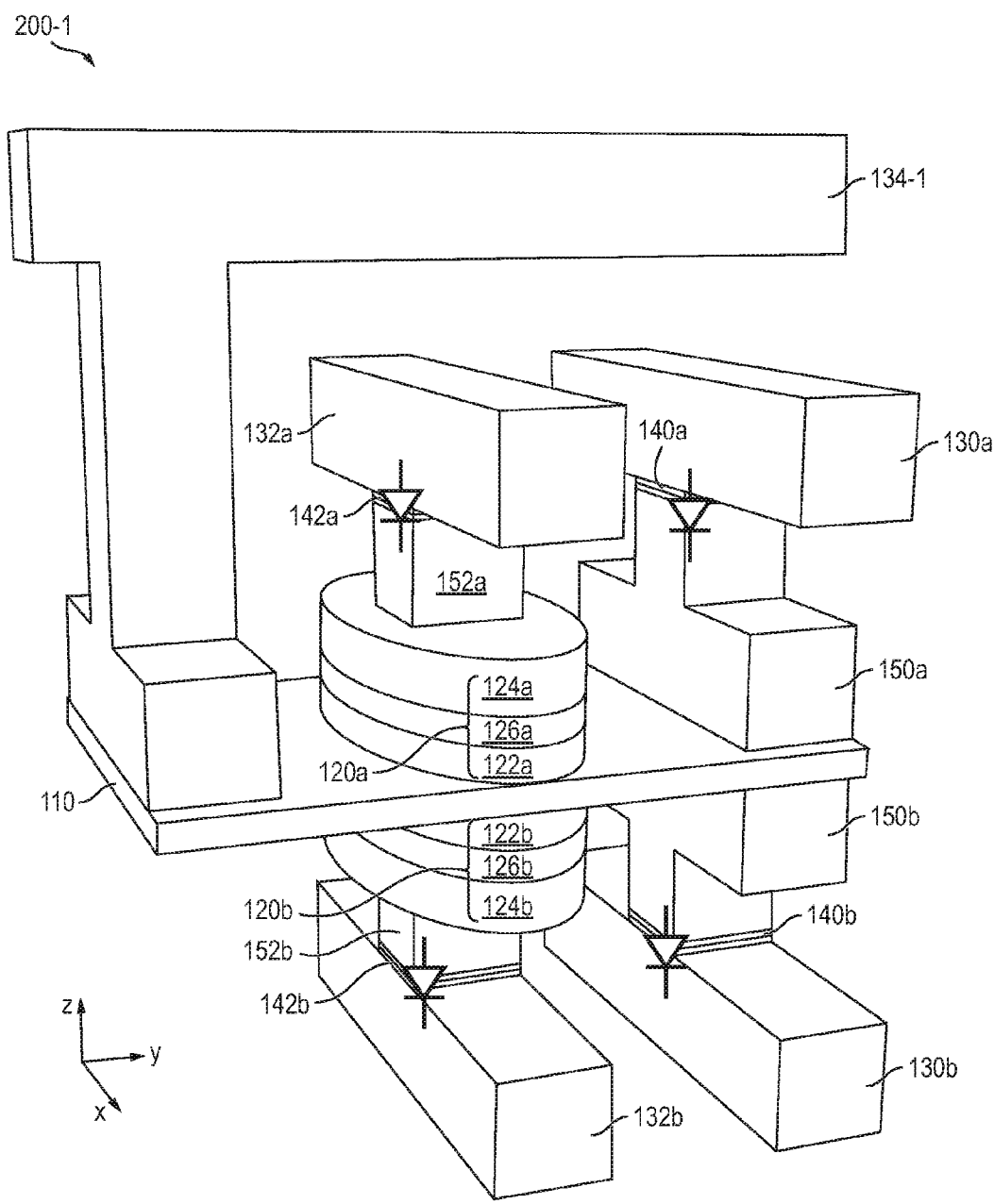
FIG. 6 is perspective view of a transverse current bi-directional bitcell, according to some other example embodiments of the present invention.

FIG. 6 is perspective view of a transverse current bi-directional bitcell 200-1, according to some example embodiments of the present invention.

According to some embodiments, the transverse current bi-directional bitcell 200-1 includes two MTJ stacks 120a and 120b, rather than one, which are located at opposite sides of the thin spin hall metal 110. The stacking axis (i.e., along the Z direction) of the two MTJ stacks 120a and 120b may be aligned as shown in FIG. 6 (i.e., the MTJ stacks 120a and 120b may be stacked on top of one another), or may be offset from each other in the transverse direction (i.e., be offset along the X-Y plane). The first and second pinned layer 124a and 124b have an axis of magnetization that is in plane and aligned along the same direction (e.g., the X direction). The first and second free layers 122a and 122b are adjacent to, and at opposite sides of the thin spin hall metal 110. The spin hall metal 110 extends on both sides of the MTJ stacks 120a and 120b such that when charge current flows through the spin hall metal 110 (e.g., in the Y direction), it is orthogonal to the axis of magnetization of the pinned layers 124a and 124b.

In some embodiments, the first and second write wordlines (WLW+ and WLW−) 130a and 130b are coupled to opposite sides of the thin spin hall metal 110 via two write diodes 140a and 140b of opposite polarity, which electrically isolate the first and second write wordlines 130a and 130b from one another. The first and second write wordlines 130a and 130b selectively enable or disable writes to the two MTJ stacks 120a and 120b. The first and second pinned layers 124a and 124b are respectively coupled to the first and second read wordlines (WLR+ and WLR−) 132a and 132b, via respective ones of the first and second read diodes 144a and 144b, which have opposite polarities. The first and second read wordlines 132a and 132b selectively enable or disable reads from the two MTJ stacks 120a and 120b. A single bitline (BL) 134-1 is coupled to (e.g. makes contact with) one side of the spin hall metal 110.

While the bitcell 200-1 has a compact architecture with features appearing on opposite sides of the spin hall metal 110, embodiments of the present invention are not limited thereto. For example, the first and second write wordlines 130a and 130b and the corresponding contacts 150a and 150b may be located on the same side (e.g., top side) of the spin hall metal 110. Further, the two MTJ stacks 120a and 120b may be located on the same side (e.g., top side) of the spin hall metal 110, with the pinned layers 124a and 124b having opposite orientations (e.g., the axis of magnetization of one being in the +X direction and the other being in the −X direction).

The opposing MTJ stacks 120a and 120b enable the bitcell 200-1 to store complementary charge states, which improves the signal-to-noise ratio (SNR) during a read operation. Additionally, the bitcell 200-1 may enables a differential voltage readout, which simplifies the corresponding readout circuitry relative to the single stack bitcell 200 in which differences in resistance are measured. Further, the complementary structure of the bitcell 200-1 allows the bitcell to take advantage of the spin hall current forming on a side of the spin hall metal 110 opposite from the first MTJ stack 120a to write to the second MTJ stack 120b.

Figure 7A:
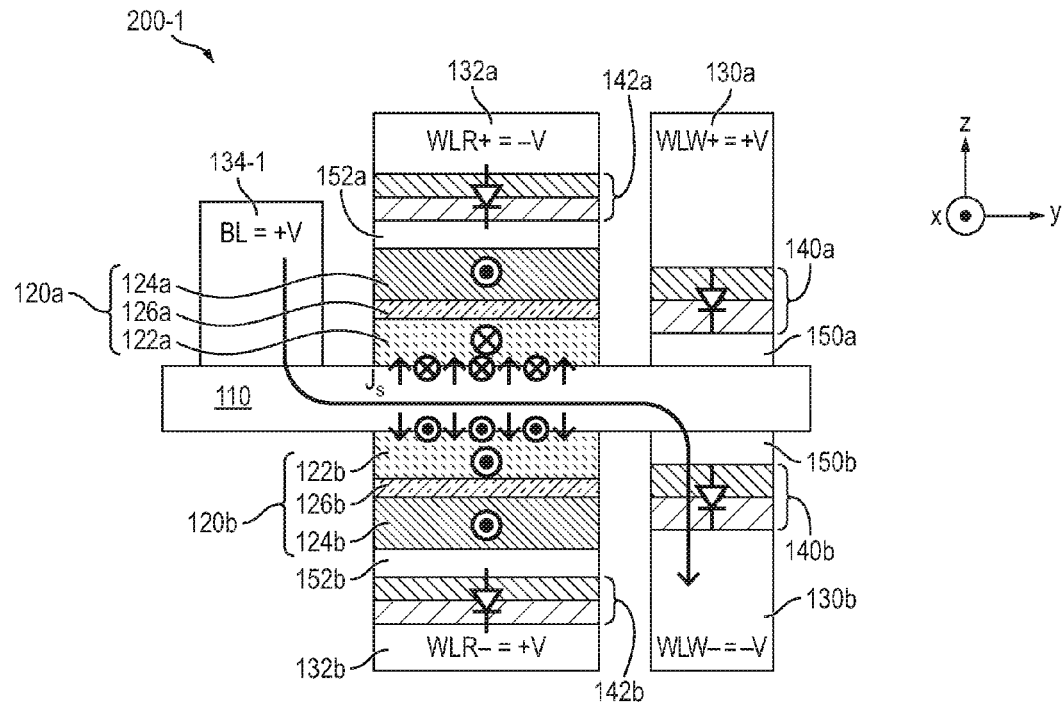
FIGS. 7A-7B are cross-sectional schematic representations of the transverse current bi-directional bitcell when in write mode, according to some example embodiments of the present invention.
Figure 7B:
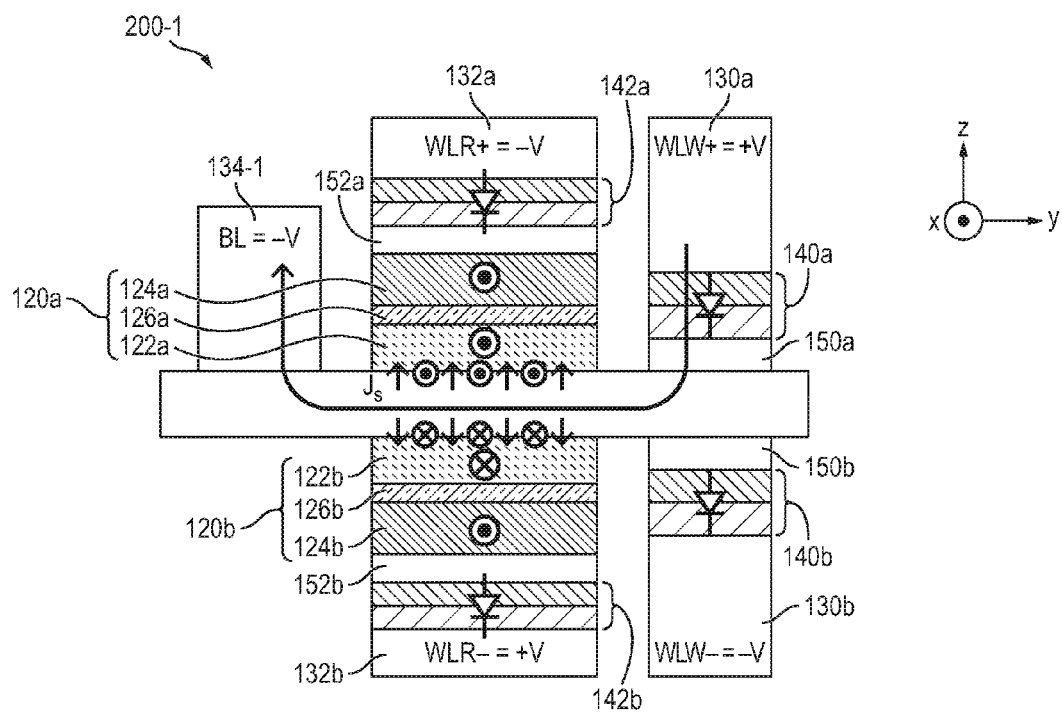

FIGS. 7A-7B are cross-sectional schematic representations of the transverse current bi-directional bitcell 200-1 when in write mode, according to some example embodiments of the present invention.

Referring to FIGS. 7A-7B, in some embodiments, the bitcell 200-1 may be written to by forward-biasing one of the first and second write diodes 140a and 140b, and by reverse-biasing the read diodes 142a and 142b. In some examples, this may be achieved by applying the positive voltage (+V) to the first write wordline 130a and the second read wordline 132b, and by applying the negative voltage (−V) to the second write wordline 130b and the first read wordline 132a.

Further, by applying a positive or negative voltage to the bitline 134-1, the complementary charge states of the first and second MTJ stacks may be controlled.

In the example of FIGS. 7A-7B, when in write mode, by applying the positive voltage to the bitline 134-1, a charge current is established between the bitline 134-1 and the second write wordline 130b and through the spin hall metal (e.g., in the +Y direction), which induces a magnetic moment in the first free layer 122a of the first MTJ stack 120a that is anti-parallel with the magnetic moment of the first pinned layer 124a (e.g., is in the −X direction) and induces a magnetic moment in the second free layer 122b of the second MTJ stack 120b that is parallel with the magnetic moment of the second pinned layer 124b (e.g., is in the +X direction). This may be tantamount to writing a '0' binary bit in the first MTJ stack 120a and a '1' binary bit in the second MTJ stack 120b. Similarly, by applying the negative voltage to the bitline 134-1, a charge current is established between the first write wordline 130a and the bitline 134-1 and through the spin hall metal (e.g., in the −Y direction), which induces a magnetic moment in the first free layer 122a of the first MTJ stack 120a that is parallel with the magnetic moment of the first pinned layer 124a (e.g., is in the +X direction) and induces a magnetic moment in the second free layer 122b of the second MTJ stack 120b that is anti-parallel with the magnetic moment of the second pinned layer 124b (e.g., is in the −X direction). This may be tantamount to writing a '1' binary bit in the first MTJ stack 120a and a '0' binary bit in the second MTJ stack 120b.

Figure 8A:
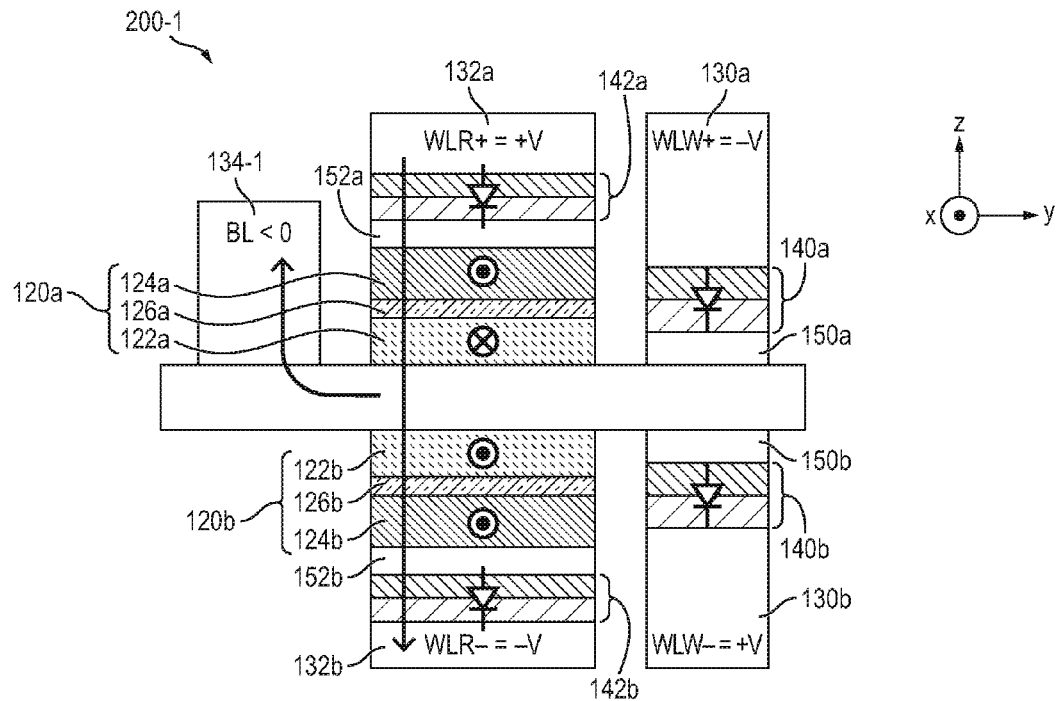
FIGS. 8A-8B are cross-sectional schematic representations of the transverse current bi-directional bitcell when in read mode, according to some example embodiments of the present invention.
Figure 8B:
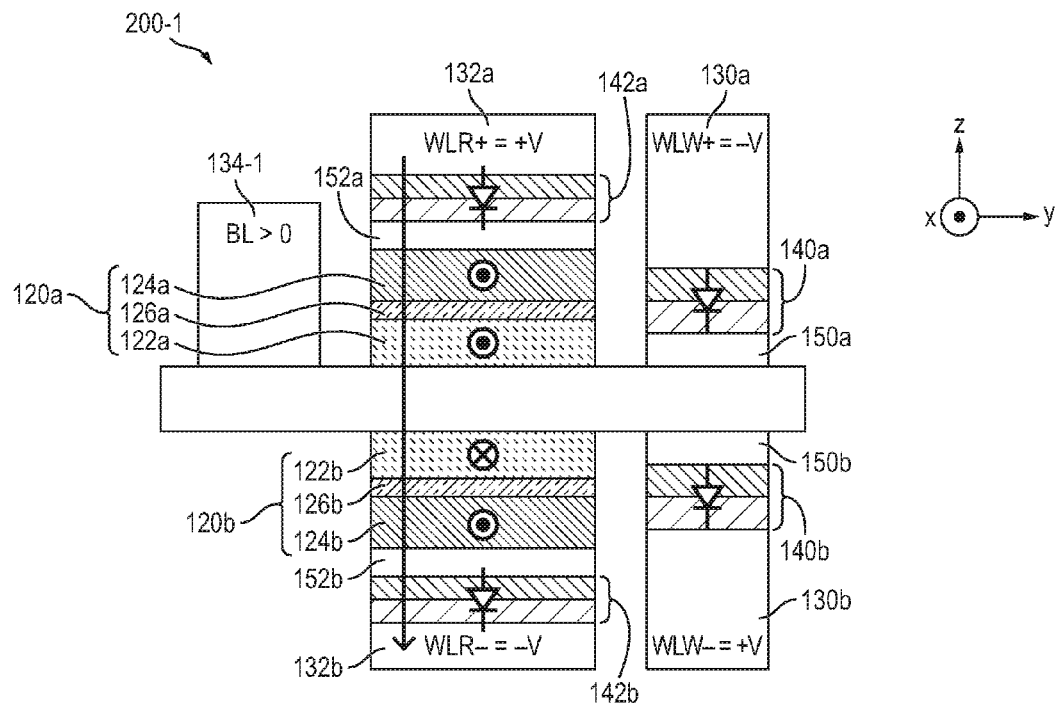

FIGS. 8A-8B are cross-sectional schematic representations of the transverse current bi-directional bitcell 200-1 when in read mode, according to some example embodiments of the present invention.

Referring to FIGS. 8A-8B, in some embodiments, the bitcell 200-1 may be read from by forward-biasing the first and second read diodes 142a and 142b, by reverse-biasing the first and second write diodes 140a and 140b, and by sensing the voltage at the bitline 134-1. In some examples, this may be achieved by applying the positive voltage (+V) to the first read wordline 132a and the second write wordline 130b, and by applying the negative voltage (−V) to the second read wordline 132b and the first write wordline 130a.

In the example of FIGS. 8A-8B, the forward biasing of the first and second read diodes 142a and 142b causes a charge current to be established between the first and second read wordlines 132a and 132b and through the resistive path of the first and second MTJ stacks 120a and 120b, which are in complimentary high and low resistance states. As the first and second MTJ stacks 120a and 120b form a voltage divider, the voltage at the bitline 134-1 may be determined by the following Equation:

$$V_{BL} = \left(\frac{R_2 - R_1}{R_1 + R_2}\right)V \quad \text{(Equation 4)}$$

where $R_1$ and $R_2$ represent the resistance of the first and second MTJ stacks 120a and 120b, respectively, and $V_{BL}$ represents the sensed voltage at the bitline 134-1.

As shown in FIG. 8A, when the first MTJ stack 120a has an anti-parallel configuration and the second MTJ stack 120b has a parallel configuration, the first MTJ stack 120a exhibits a large resistance, and the second MTJ stack 120b exhibits a small resistance, leading to sensed bitline voltage $V_{BL}$ that is less than 0 V. Conversely, as shown in FIG. 8B, when the first MTJ stack 120a has a parallel configuration and the second MTJ stack 120b has an anti-parallel configuration, the first MTJ stack 120a exhibits a small resistance, and the second MTJ stack 120b exhibits a large resistance, leading to sensed bitline voltage $V_{BL}$ that is greater than 0 V.

Therefore, according to some embodiments, the charge state of the MTJ stacks 120a and 120b (and thus the corresponding binary bits stored at the bitcell 200-1) may be readily determined by comparing the sensed bitline voltage $V_{BL}$ at the bitline 134-1 with a reference voltage, which may be at the halfway point between the positive and negative voltages (e.g., about 0 V).

According to some embodiments of the present invention, the bitcell 200-1 may be placed into a disable mode by reverse-biasing all of the diodes 140a, 140b, 142a, and 142b. Such a state prevents any current from flowing through the spin hall metal 110 and the two MTJ stacks 120a and 120b, which will prevent any reading or writing operations from being performed on the bitcell 200-1. In some examples, the bitcell 200 may be placed in disable mode by applying the negative voltage (−V) to the first write wordline 130a and the first read wordline 132a, and by applying the positive voltage (+V) to the second write wordline 130b and the second read wordline 132b.

Figure 9A:
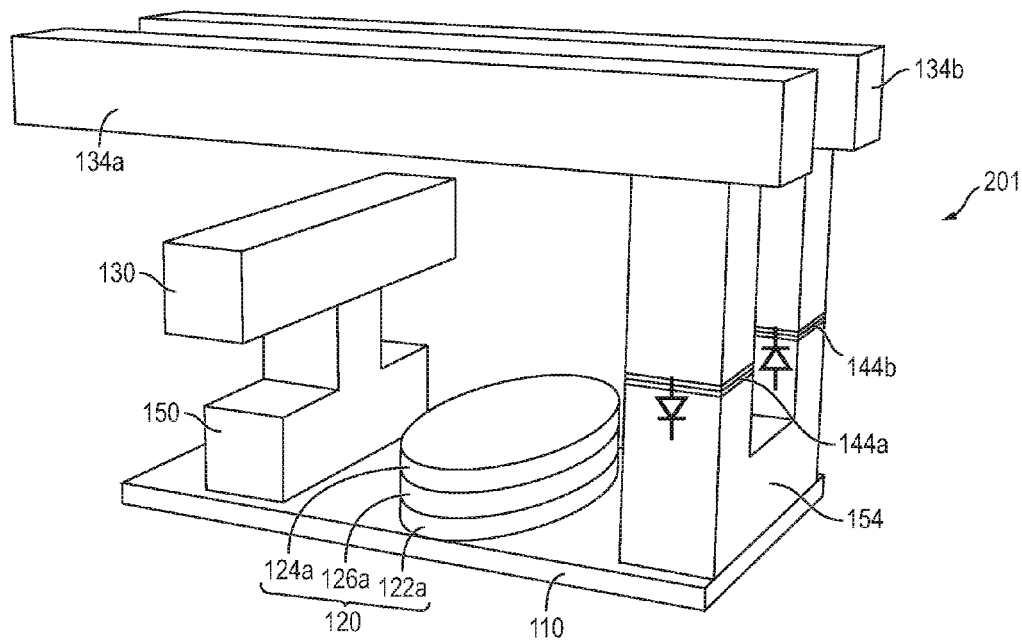
FIG. 9A is perspective view of a write block of the bitcell, according to some example embodiments of the present invention.
Figure 9B:
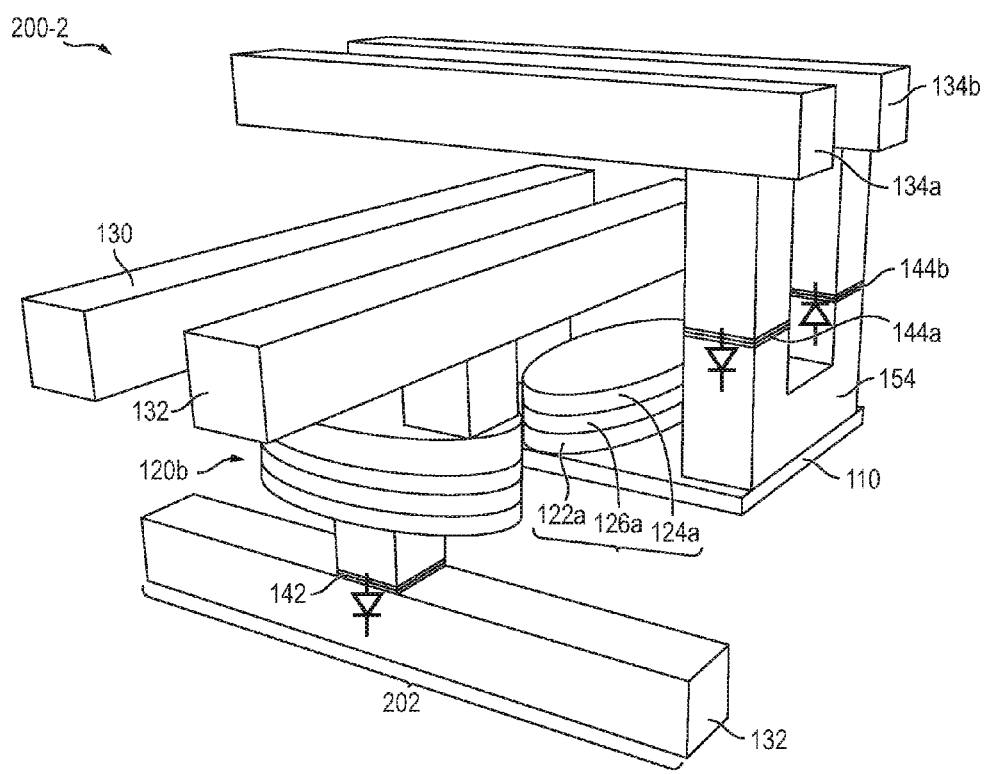
FIGS. 9B-9C are perspective views of the bitcell utilizing separate write and read blocks, according to some example embodiments of the present invention.
Figure 9C:
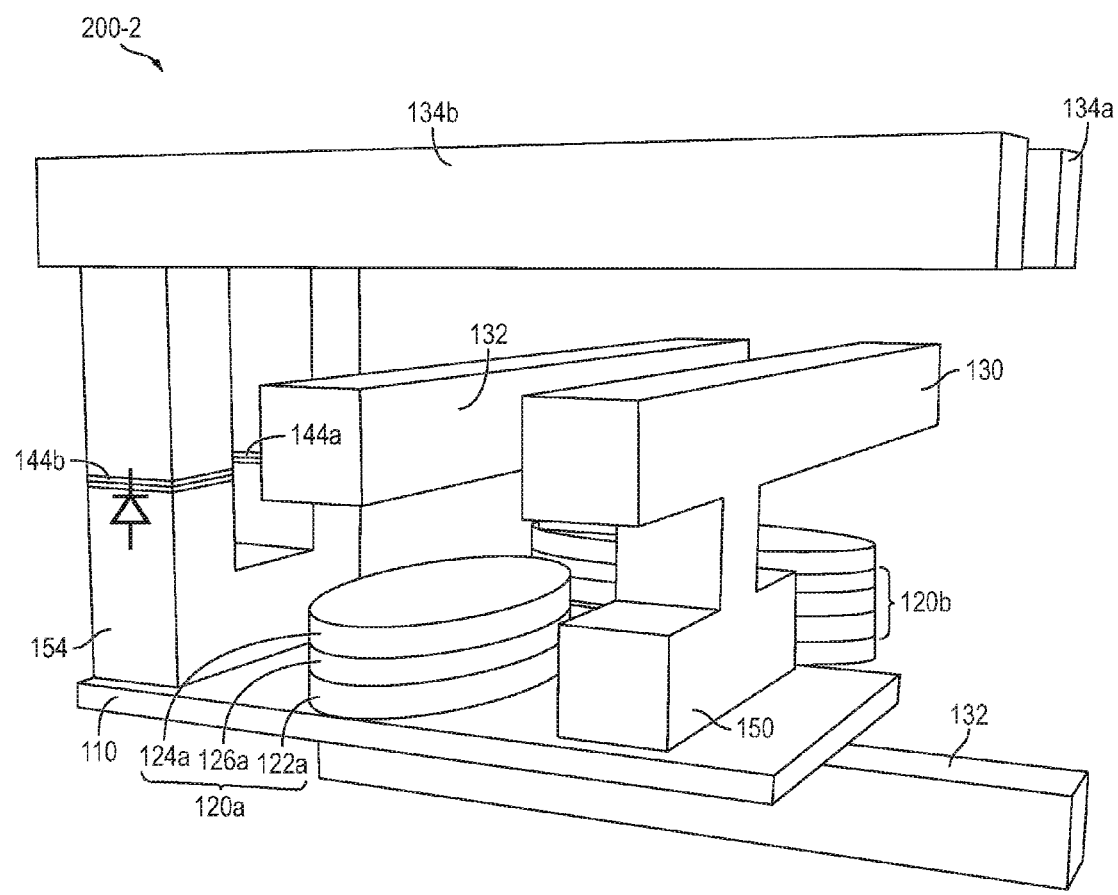

FIG. 9A is perspective view of a write block 201 of the bitcell 200-2, according to some example embodiments of the present invention. FIGS. 9B-9C are perspective views of the bitcell 200-2 utilizing separate write and read blocks 201 and 202, according to some example embodiments of the present invention.

Referring to FIG. 9A, the write unit 201 may be substantially similar to the bitcell 200 illustrated in FIG. 2A-2B, except that only a single write bitline 130 is used, which contacts the spin hall metal 110 without the intervening diode, and no read bitline exists. The write operation using the write block 201 is similar to that performed using the bitcell 200; as such, a description of the operation may not be repeated.

Referring to FIGS. 9B-9C, the bitcell 200-2, according to some embodiments, includes electrically isolated write and read units 201 and 202. The read block 202 of the bitcell 200-2 includes a second MTJ stack 120b that is a slave to the first MTJ stack 120a via dipolar coupling, which causes the magnetization of the free layer of the second MTJ stack 120b to mirror that of the first MTJ stack 120a of the write unit 201. That is, when the write unit 201 switches, so does the read unit 202.

While FIGS. 9A-9C illustrate the two wordlines 134a and 134b as contacting one side of the spin hall metal 110 via a shared contact 154, embodiments of the present invention are not limited thereto, and the wordlines 134a and 134b may contact opposite sides (e.g., top and bottom) of the spin hall metal 110 via separate contacts.

Figure 10:
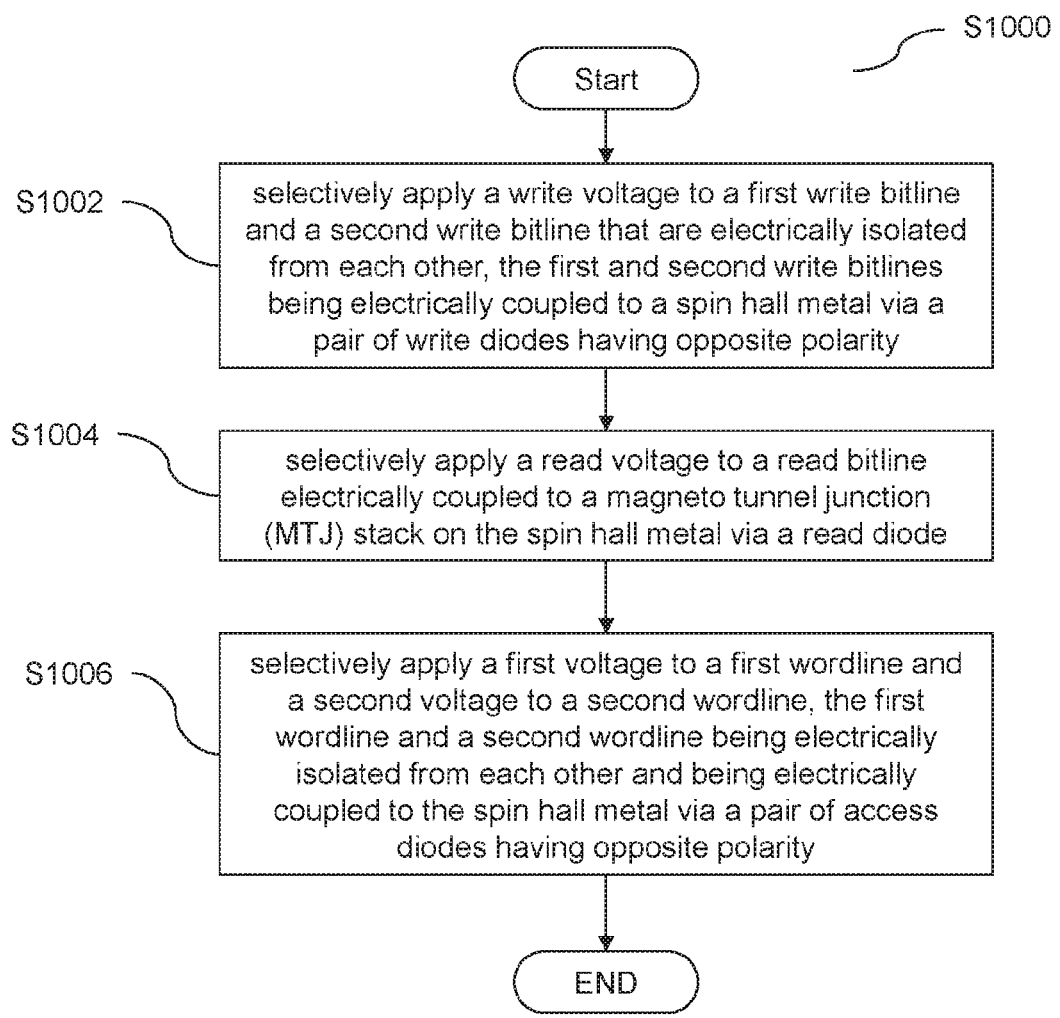
FIG. 10 is a flow diagram illustrating a process for controlling an operational state of the transverse current bi-directional bitcell, according to some embodiments of the present invention.

FIG. 10 is a flow diagram illustrating a process 1000 for controlling an operational state of the transverse current bi-directional bitcell 100, according to some embodiments of the present invention.

In act 1002, an external circuit selectively applies a write voltage (e.g., the positive or negative voltage) to the first write bitline 130a and the second write bitline 130b, which are electrically isolated from each other. The first and second write bitlines 130a and 130b are electrically coupled to the spin hall metal 110 via a pair of write diodes 140a and 140b having opposite polarity.

In act 1004, an external circuit selectively applies a read voltage (e.g. a positive voltage) to the read bitline 132, which is electrically coupled to the MTJ stack 120 that is on the spin hall metal 110 via the read diode 142.

In act 1006, an external circuit selectively applies a first voltage to a first wordline 134a and a second voltage to a second wordline 134b. The first and second wordlines 134a and 134b are electrically isolated from each other and are electrically coupled to the spin hall metal 110 via the pair of access diodes 144a and 144b having opposite polarity. When in disable mode, one of the first and second voltages is the negative voltage while the other is the positive voltage. The first and second voltages are equal to a ground voltage (e.g., 0 V), when in write mode, and are equal to the negative voltage, when in read mode.

As described herein, a transverse bi-directional bitcell, according to the embodiments of the present invention includes a material with a large spin hall angle adjacent to a free layer in an MTJ stack. The MTJ stack is written by a diffusive spin torque current injected from an interface across which a charge current flows. Due to the properties of such an interface the spin current can be substantially larger than the charge current, thus reducing the write current required. As the write charge current is transverse to the free layer of the MTJ stack, and does not flow through the MTJ stack (e.g., through the oxide tunneling barrier layer), endurance of the bitcell is significantly improved as compared to conventional designs. The use of diodes by the present embodiments enables the spin orbital torque diffusive spin injection while eliminating the need for any access transistors, which reduces the transistors used in a given block of cache/memory. Additionally, the use of diodes reduces bitcell complexity and size relative to conventional designs, which turn improves (e.g., increases) the cell density of the memory/cache block.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the inventive concept.

In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on," "connected to," "coupled to," or "adjacent" another element or layer, it can be directly on, connected to, coupled to, or adjacent the other element or layer, or one or more intervening elements or layers may be present. When an element or layer is referred to as being "directly on," "directly connected to," "directly coupled to," or "immediately adjacent" another element or layer, there are no intervening elements or layers present.

As used herein, "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

The data retention system and/or any other relevant devices or components according to embodiments of the present invention described herein may be implemented utilizing any suitable hardware, firmware (e.g., an application-specific integrated circuit), software, or a suitable combination of software, firmware, and hardware. For example, the various components of the data retention system may be formed on one integrated circuit (IC) chip or on separate IC chips. Further, the various components of the data retention system may be implemented on a flexible printed circuit film, a tape carrier package (TCP), a printed circuit board (PCB), or formed on a same substrate. Further, the various components of the data retention system may be a process or thread, running on one or more processors, in one or more computing devices, executing computer program instructions and interacting with other system components for performing the various functionalities described herein.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

While this invention has been described in detail with particular references to illustrative embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

What is claimed is:

1. A transverse current bi-directional bitcell coupled to an external circuit and configured to store a charge state, the transverse current bi-directional bitcell comprising:
    a spin hall metal configured to pass through a charge current;
    a magneto tunnel junction (MTJ) stack on the spin hall metal and configured to generate and store a non-volatile spin state corresponding to a binary bit in response to passage of the charge current through the spin hall metal, and to generate the charge current corresponding to the non-volatile spin state in response to application of a read voltage;
    a first write bitline and a second write bitline electrically isolated from the first write bitline, the first and second write bitlines being electrically coupled to the spin hall metal via a pair of write diodes having opposite polarity, the first and second write bitlines being configured to source the charge current through the spin hall metal, during a write operation, in response to a write voltage being applied to both of the first and second write bitlines; and
    a read bitline electrically coupled to the MTJ stack via a read diode, the read bitline being configured to induce the charge current through the spin hall metal, during a read operation, in response to the read voltage being applied to the read bitline; and
    a first wordline and a second wordline electrically coupled to the spin hall metal via a pair of access diodes having opposite polarity and configured to permit a flow of the charge current through spin hall metal in response to a wordline voltage being applied to both the first and second wordlines.

2. A transverse current bi-directional bitcell of claim 1, wherein the first write bitline is electrically isolated from the second write bitline, and
    wherein the second wordline is electrically isolated from the first wordline.

3. A transverse current bi-directional bitcell of claim 1, wherein the spin hall metal exhibits a large spin hall angle such that a density of spin torque current flowing through the MTJ stack is larger than that of the transverse charge current flowing through the spin hall metal.

4. A transverse current bi-directional bitcell of claim 1, wherein the spin hall metal comprises beta tantalum, platinum, and/or copper bismuth.

5. A transverse current bi-directional bitcell of claim 1, wherein the MTJ stack contacts the spin hall metal at an interface plane, and
    wherein the MTJ stack comprises:
        a free layer comprising magnetic material and configured to exhibit an easy axis of magnetization parallel with the interface plane, and to respond to a spin current corresponding to the charge current flowing through the spin hall metal based on a giant spin hall effect;
        a pinned layer comprising magnetic material and exhibiting a fixed axis of magnetization parallel with the interface plane and unaffected by stray fields resulting from the charge current flowing through the spin hall metal; and
        a non-magnetic layer between the free and pinned layers and configured to magnetically isolate a free magnetic moment of the free layer from a fixed magnetic moment of the pinned layer and to maintain any existing difference in directionality of the free and fixed magnetic moments.

6. A transverse current bi-directional bitcell of claim 5, wherein the MTJ stack has an elliptical cross section along a transverse direction parallel with the interface plane, the elliptical cross section having a long axis in a same direction as a fixed axis of magnetization of the pinned layer.

7. A transverse current bi-directional bitcell of claim 1, wherein, in response to the charge current flowing through the spin hall metal, the MTJ stack is configured to exhibit magnetic moments having a parallel configuration or anti-parallel configuration, and
    wherein the MTJ stacks is configured to maintain the parallel or anti-parallel configuration even when no power is provided to the transverse current bi-directional bitcell.

8. A transverse current bi-directional bitcell of claim 1, wherein a magnitude of the write voltage is greater than or equal to a forward-bias voltage of the pair of write diodes,
    wherein a magnitude of the read voltage is greater than or equal to a forward-bias voltage of the read diodes, and wherein the wordline voltage being applied to the first and second wordlines is zero volts during the write operation, and has a magnitude greater than or equal to a forward-bias voltage of the pair of access diodes.

9. A transverse current bi-directional bitcell of claim 1, wherein the first and second write bitlines are coupled to the spin hall metal on one side of the MTJ stack, and the first and second wordlines are coupled to the spin hall metal on an opposite side of the MTJ stack, and
wherein the read bitline is electrically coupled to a pinned layer of the MTJ stack.

10. A transverse current bi-directional bitcell of claim 1, wherein the first write bitline and the first wordline are coupled to the spin hall metal on one side of the MTJ stack, and the second write bitline and the second wordline are coupled to the spin hall metal on an opposite side of the MTJ stack, and
wherein the read bitline is electrically coupled to a pinned layer of the MTJ stack.

11. A transverse current bi-directional bitcell of claim 1, wherein the charge current is transverse to a stacking direction of the MTJ stack and does not flow through the MTJ stack during the write operation.

12. A method of controlling an operational state of a transverse current bi-directional bitcell configured to store a charge state using an external circuit and, the method comprising:
selectively applying a write voltage to a first write bitline and a second write bitline that are electrically isolated from each other, the first and second write bitlines being electrically coupled to a spin hall metal via a pair of write diodes having opposite polarity;
selectively applying a read voltage to a read bitline electrically coupled to a magneto tunnel junction (MTJ) stack on the spin hall metal via a read diode; and
selectively applying a first voltage to a first wordline and a second voltage to a second wordline, the first wordline and a second wordline being electrically isolated from each other and being electrically coupled to the spin hall metal via a pair of access diodes having opposite polarity.

13. The method of claim 12, wherein the MTJ stack contacts the spin hall metal at an interface plane, and
wherein the MTJ stack comprises:
a free layer comprising magnetic material and configured to exhibit an easy axis of magnetization parallel with the interface plane, and to respond to a spin current corresponding to a charge current flowing through the spin hall metal based on a giant spin hall effect;
a pinned layer comprising magnetic material and exhibiting a fixed axis of magnetization parallel with the interface plane and unaffected by stray fields resulting from the charge current flowing through the spin hall metal; and
a non-magnetic layer between the free and pinned layers and configured to magnetically isolate a free magnetic moment of the free layer from a fixed magnetic moment of the pinned layer and to maintain any existing difference in directionality of the free and fixed magnetic moments.

14. The method of claim 12, further comprising disabling the bitcell by:
reverse-biasing the read diode by applying a negative voltage to the read bitline;
reverse-biasing the pair of write diodes by applying the negative voltage to the first write bitline and applying a positive voltage to the second write bitline; and
reverse-biasing the pair of access diodes by applying the negative voltage to the first wordline and applying the positive voltage to the wordline.

15. The method of claim 14, wherein the positive voltage is greater than or equal to a forward-bias voltage of the pair of write and access diodes, and
wherein the negative voltage has a same magnitude as that of positive voltage and has a polarity opposite that of the positive voltage.

16. The method of claim 12, further comprising writing a charge state to the bitcell by:
reverse-biasing the read diode by applying a negative voltage to the read bitline;
reverse-biasing the pair of access diodes by applying a ground voltage to the first and second wordlines; and
forward-biasing one of the pair of write diodes by applying the write voltage to the first and second write bitlines to establish a charge current through the spin hall metal, the charge current inducing a magnetic moment in a free layer of the MTJ stack corresponding to a binary bit.

17. The method of claim 16, wherein applying the write voltage to the first and second write bitlines reverse-biases an other one of pair of write diodes.

18. The method of claim 16, wherein the write voltage is equal to a positive voltage or the negative voltage, and
wherein the positive voltage is greater than or equal to a forward-bias voltage of the pair of write diodes.

19. The method of claim 12, further comprising reading a charge state from the bitcell by:
forward-biasing the read diode by applying a positive voltage to the read bitline;
reverse-biasing the pair of write diodes by applying the positive voltage to one of the pair of write diodes and by applying a negative voltage to an other one of the pair of write diodes; and
forward-biasing one of the pair of access diodes by applying the negative voltage to the first and second wordlines to establish a charge current through the spin hall metal, the charge current corresponding to a magnetic moment in a free layer of the MTJ stack, the magnetic moment corresponding to a stored binary bit.

20. The method of claim 19, wherein applying the read voltage to the first and second wordlines reverse-biases an other one of pair of access diodes.

* * * * *